(12) United States Patent
Yoshizawa

(10) Patent No.: US 7,775,362 B2
(45) Date of Patent: Aug. 17, 2010

(54) SUBSTRATE ACCOMMODATING APPARATUS WITH LOOP-SHAPED BINDING MEMBER

(75) Inventor: Takenori Yoshizawa, Tsu (JP)

(73) Assignee: Sharp Kabushiki Kaisha, Osaka (JP)

(*) Notice: Subject to any disclaimer, the term of this patent is extended or adjusted under 35 U.S.C. 154(b) by 189 days.

(21) Appl. No.: 12/064,017

(22) PCT Filed: Apr. 24, 2006

(86) PCT No.: PCT/JP2006/308577

§ 371 (c)(1),
(2), (4) Date: Feb. 15, 2008

(87) PCT Pub. No.: WO2007/043207

PCT Pub. Date: Apr. 19, 2007

(65) Prior Publication Data

US 2009/0272669 A1 Nov. 5, 2009

(30) Foreign Application Priority Data

Oct. 7, 2005 (JP) .............................. 2005-295547

(51) Int. Cl.
*B65D 85/48* (2006.01)
*B65D 19/00* (2006.01)
*B65D 21/00* (2006.01)
*A47F 1/06* (2006.01)

(52) U.S. Cl. ...................... 206/454; 206/386; 206/499; 206/509; 211/59.1; 211/59.4; 220/23.83; 414/795.7

(58) Field of Classification Search ......... 206/449–456, 206/499, 509; 211/49.1–57.1, 59.1, 59.4; 220/23.83; 29/739, 740, 744; 414/422, 795.7, 414/797.5, 937
See application file for complete search history.

(56) References Cited

U.S. PATENT DOCUMENTS

| | | | | |
|---|---|---|---|---|
| 3,349,900 A | * | 10/1967 | Jones et al. | 206/454 |
| 3,695,424 A | * | 10/1972 | Cristy et al. | 206/455 |
| 4,043,485 A | * | 8/1977 | Tippetts | 206/499 |
| 5,186,338 A | * | 2/1993 | Boutet | 206/455 |
| 6,446,807 B1 | * | 9/2002 | Lafond et al. | 206/456 |
| 7,014,415 B2 | * | 3/2006 | Yoshizawa | 414/797.5 |

(Continued)

FOREIGN PATENT DOCUMENTS

JP        5-42980 A      2/1993

(Continued)

*Primary Examiner*—Bryon P Gehman
(74) *Attorney, Agent, or Firm*—Birch, Stewart, Kolasch & Birch, LLP

(57) ABSTRACT

A substrate accommodating apparatus (10) is constituted by stacking a plurality of accommodation bodies (20) on an upper surface of a rigid plate (15). Each accommodation body (20) is provided with a buffer (21) having elasticity and some conductivity and a load receptacle (22) having a frame-shaped body, while an upper surface of the buffer (21) is provided with a substrate protect layer (23) made of cellulose. The substrate accommodating apparatus (10) is arranged to enclose a substrate (S) therein by stacking the accommodation bodies (20) where the substrates are placed, and when the accommodation bodies (20) are stacked, each load receptacle (22) places the load of the respective accommodation body (20) on a periphery of the adjacent lower accommodation body (20) so that any load is not placed on the central portion of the lower accommodation body (20) where the substrate (S) is placed.

3 Claims, 6 Drawing Sheets

U.S. PATENT DOCUMENTS

| | | | |
|---|---|---|---|
| 7,329,083 B2 * | 2/2008 | Nakazato et al. | 414/788.7 |
| 7,568,281 B2 * | 8/2009 | Yoshizawa et al. | 414/286 |
| 7,579,072 B2 * | 8/2009 | Yoshizawa et al. | 428/319.1 |
| 2004/0020823 A1 | 2/2004 | Yoshizawa | |
| 2004/0145697 A1 | 7/2004 | Yoshizawa et al. | |
| 2005/0152121 A1 | 7/2005 | Yoshizawa et al. | |

FOREIGN PATENT DOCUMENTS

| | | |
|---|---|---|
| JP | 2003-040271 A | 2/2003 |
| JP | 3105536 U | 9/2004 |
| JP | 2004-359343 A | 12/2004 |
| JP | 2005178839 A | 7/2005 |

* cited by examiner

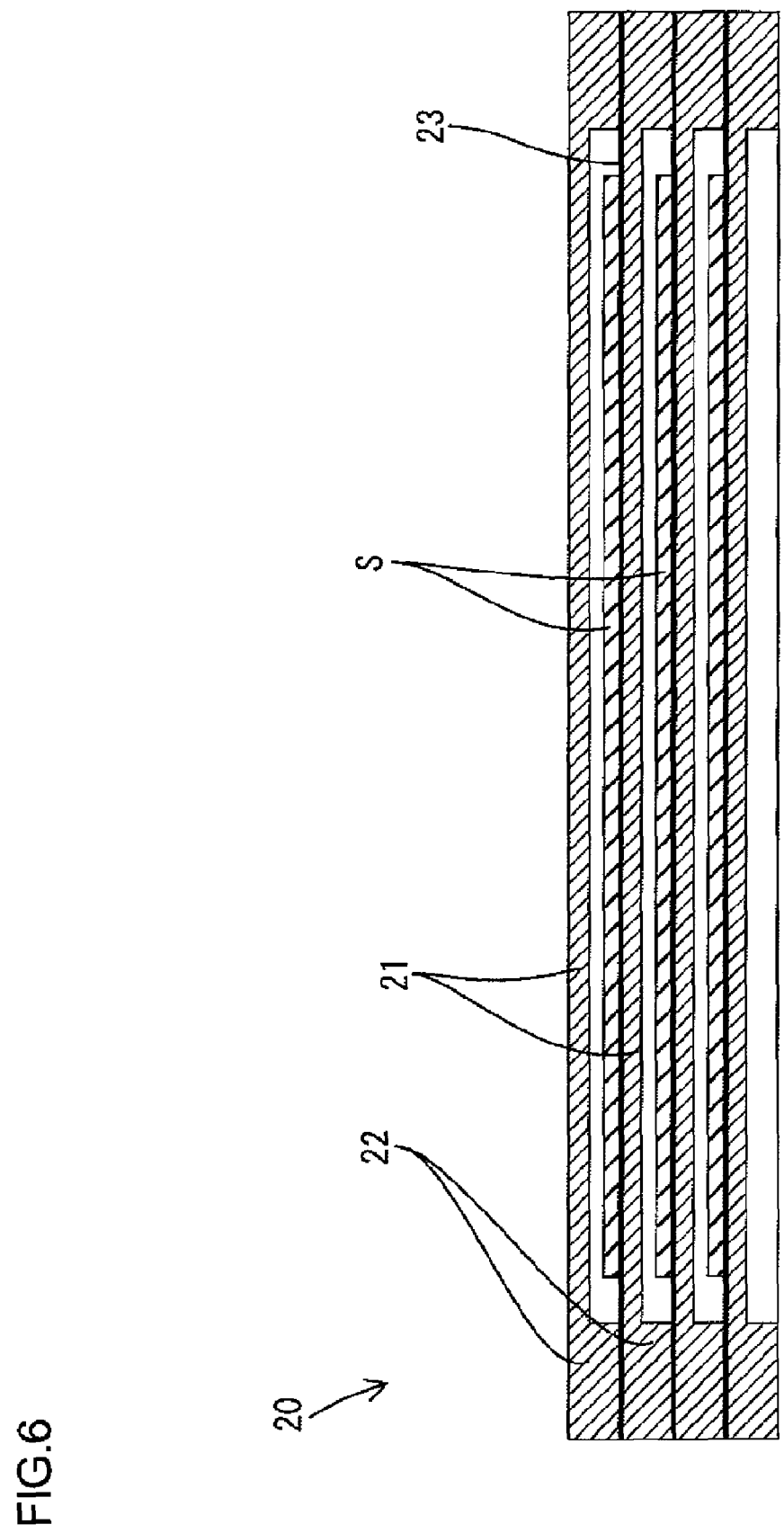

SUBSTRATE ACCOMMODATING APPARATUS WITH LOOP-SHAPED BINDING MEMBER

BACKGROUND OF THE INVENTION

1. Field of the Invention

The present invention relates to a substrate accommodating apparatus, specifically to a substrate accommodating apparatus used for transporting a large-scale substrate.

2. Description of the Related Art

Background Art

One of conventional substrate accommodating apparatus is disclosed in Patent Document 1. This apparatus has a plurality of substrate accommodation compartments defined by frames and disposed in a plane direction into a lattice shape, thereby enabling transportation of a plurality of substrates at one time.

[Patent Document 1] Japanese Utility Models Registration No. 3105536 (FIG. 1)

SUMMARY OF THE INVENTION

The conventional one as above is applicable when transporting small-scale substrates. When transporting large-scale substrates and the like, however, the area of each compartment has to be larger, and therefore the area of the accommodating apparatus as a whole has to be larger. Meanwhile, since the accommodating apparatus is to be boarded on a back of a truck and the like for transportation when transporting the substrates, the area of the accommodating apparatus has to be within a certain range. The number of compartments is then limited and, as a result, it is impossible to transport a greater number of substrates at a time.

The present invention was achieved in accordance with the circumstances as described above, and its object is to provide a substrate accommodating apparatus that enables transportation of a greater number of large-scale substrates.

Means for solving the problem as above explained are an invention, which is as below:

(1) A substrate accommodating apparatus comprising an accommodation body for enclosing a substrate and a rigid plate for supporting a plurality of accommodation bodies such that the plurality of accommodation bodies are stacked on an upper surface of the rigid plate, wherein the accommodation body including a buffer for holding the substrate and a load receptacle disposed on a periphery of the buffer so as to receive a load of the accommodation body when the accommodation body is stacked.

(2) The substrate accommodating apparatus according to the above (1), wherein the load receptacle is disposed on the whole periphery of the buffer.

(3) The substrate accommodating apparatus according to any one of the above described (1) and (2), wherein the accommodation body has an end portion, the end portion being attached to the rigid plate by a holder, and wherein the accommodation body is attached such that it is transferable to a stacked state where the plurality of accommodation bodies are vertically stacked and to a spread state where an upper one of the accommodation bodies is spread thereby allowing the substrate be placed in and taken out of the lower one of the plurality of accommodation bodies.

(4) The substrate accommodating apparatus according to any one of the above (1) to (3), wherein the holder includes a loop-shaped binding member.

(5) The substrate accommodating apparatus according to any one of the above (1) to (4), wherein the buffer has some conductivity.

(6) The substrate accommodating apparatus according to any one of the above (1) to (5), wherein the buffer has a surface for being in contact with the substrate, the surface including a substrate protect layer disposed thereon for protecting the substrate.

(7) The substrate accommodating apparatus according to the above (6), wherein the substrate protect layer is formed of cellulose.

According to the substrate accommodating apparatus as described in the above paragraph (1), the load of the vertically stacked accommodation bodies are supported by the load receptacles, and the all loads of the accommodation bodies are received by the rigid plate that is a bottom layer, and therefore any load is not placed on the substrates enclosed in the respective accommodation bodies. This enables transportation of a number of accommodation bodies accommodating substrates at a time by stacking them, which enables transportation of a number of substrates.

According to the substrate accommodating apparatus as described in the above paragraph (2), the load receptacle surrounds the whole circumference of the substrate held by the buffer. This enables the substrate accommodating apparatus to more reliably protect the substrate.

According to the substrate accommodating apparatus as described in the above paragraph (3), since the holder holds the accommodation body such that the accommodation body is transferable from a stacked state to a spread state and vise versa, it is facilitated to place the substrate in and take it out in the spread state and, after accommodating the substrate, transfer the accommodation body to the stacked state. This enables improvement of the operating efficiency.

According to the substrate accommodating apparatus as described in the above paragraph (4), the accommodation body can be attached to the rigid plate with a simple structure.

According to the substrate accommodating apparatus as described in the above paragraph (5), since the buffer has some conductivity, the substrate is prevented from electric charge. This enables to prevent the substrate from electrostatic and the like adhesion of dust, as well as to avoid causing electric influence to the substrate and a member packaged on the substrate.

According to the substrate accommodating apparatus as described in the above paragraph (6), the substrate is accommodated so as to be in contact with the substrate protect layer, and therefore is prevented from damage when being transported.

According to the substrate accommodating apparatus as described in the above paragraph (7), since the substrate protect layer is formed of cellulose, it can more reliably protect the substrate. Also, the substrate protect layer has durability and may be used repetitively. Moreover, cellulose contains few organic substances that ordinary resin materials would contain, and adhesion of such substances to the substrate is avoided even if the substrate protect layer is in direct contact with the substrate.

BRIEF DESCRIPTION OF DRAWINGS

The present invention will become more fully understood from the detailed description given hereinbelow and the accompanying drawings which are given by way of illustration only, and thus are not limitative of the present invention and wherein:

FIG. 6 is a cross-sectional view of accommodation bodies according to a third embodiment.

DETAILED DESCRIPTION OF THE INVENTION

First Embodiment

A first embodiment according to the present invention is now explained with reference to FIGS. 1 through 4.

Figure 1:
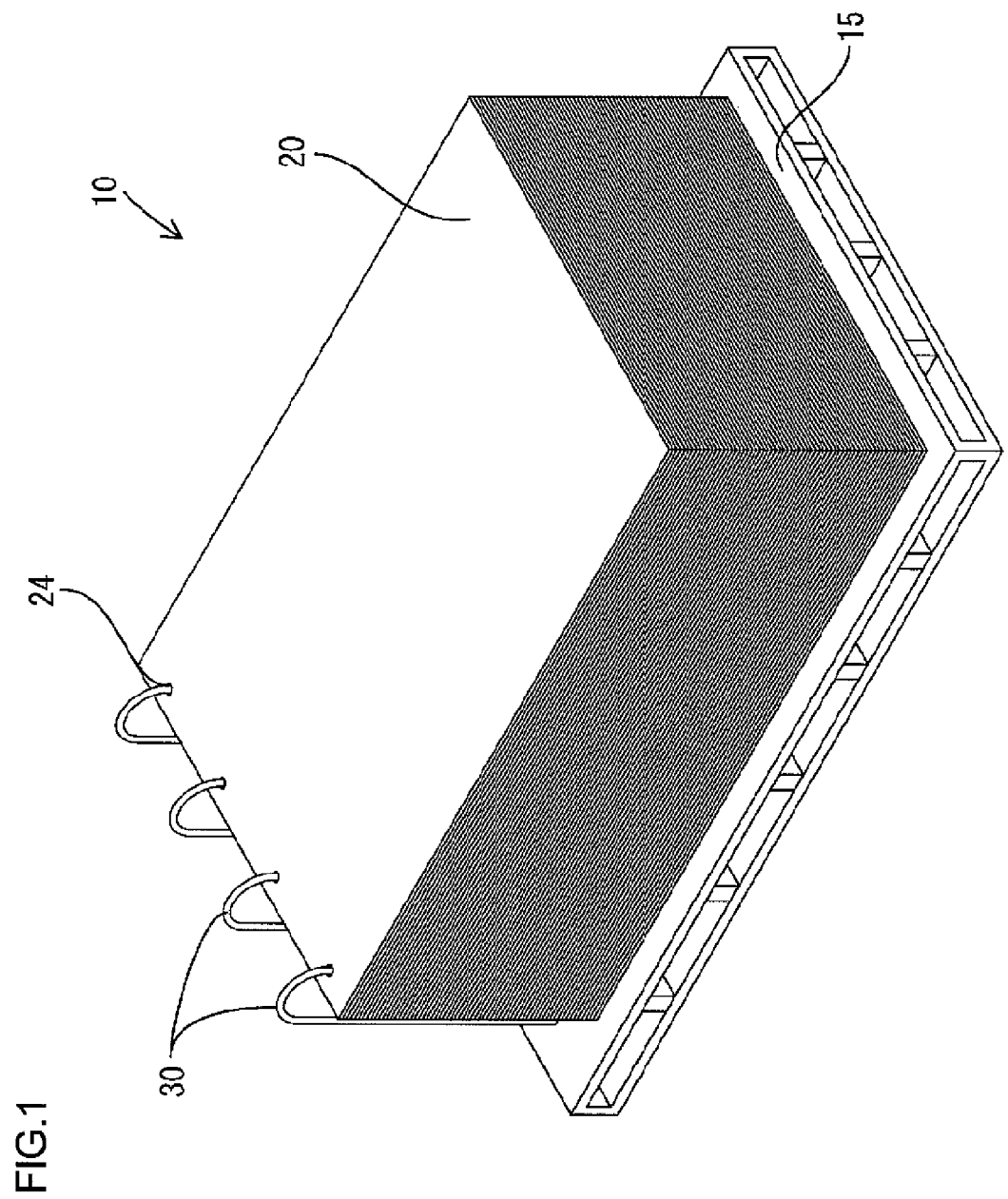
FIG. 1 is a perspective view of a substrate accommodating apparatus according to a first embodiment in a stacked state.

A substrate accommodating apparatus 10 of the present embodiment is, as shown in FIG. 1, constituted by stacking a plurality of accommodation bodies 20 on an upper surface of a rigid plate 15.

The rigid plate 15 includes two metal plates being on the vertical of each other and a plurality of beams disposed in parallel lows between the metal plates, and has sufficient rigidity. The substrate accommodating apparatus 10 is arranged to be supported at the rigid plate 15 for transportation. For example, it is arranged such that a fork of a forklift is inserted into open sided cavities of the rigid plate 15 for easy transportation of the substrate accommodating apparatus 10.

In addition, in the present embodiment, the rigid plate 15 is made of stainless steel, and has sufficient rigidity and corrosion resistance.

Each accommodation body 20 includes a buffer 21 and a load receptacle 22.

The buffer 21 is made of polypropylene with addition of carbon and formed in a thin plate shape, with having elasticity and some conductivity (having electrical resistance in a range around $10^{11}$-$10^{12}$ ohms). The buffer 21 is arranged such that, with the substrate S being placed on the central portion of the buffer 21, elastically holding the substrate S to prevent action of shock and the like to the substrate S, as well as to avoid electrostatic charge of the substrate S. Moreover, a substrate protect layer 23 made of cellulose is disposed on an upper surface of the buffer 21, and the buffer 21 is arranged to contact the substrate S with the upper surface of the substrate protect layer 23, thereby preventing rise of adhesion of resin constituent to the substrate S and damages and the like.

The load receptacle 22 is made of aluminum and formed in a frame shape on a periphery of the lower surface of the buffer 21. That is, the load receptacle 22 is disposed in a frame shape all along the lower periphery of the buffer 21 so as to support the whole accommodation body 20.

Also, the each accommodation body 20 is stacked onto an upper surface of the adjacent lower accommodation body 20 with abutting the load receptacle 22 thereonto. The load receptacle 22, then, is placed on an upper periphery of the buffer 21 of the adjacent lower accommodation body 20. The load receptacle 22 is thus arranged to surround the circumference of the substrate S placed on the adjacent lower accommodation body 20 to prevent contact of the substrate S with exterior parts and the like, thereby protecting the substrate S.

Now, the accommodation bodies 20 of the present embodiment are attached on the rigid plate 15 with loop-shaped holders 30.

Each of the loop-shaped holders 30 is formed by bending a stick-shaped member into a substantially U-shape and piercingly fixing the ends (an open end of the U shape) into the rigid plate 15, thereby having a loop shape as a whole. That is, each loop-shaped holder 30 is constituted by a loop-shaped binding member capable of binding a plurality of accommodation bodies 20.

The loop-shaped holders 30 each are inserted in respective insertion holes 24 drilled in the end portion on one of the narrow sides of each of the accommodation body 20. The accommodation bodies 20 are thus arranged to be movable along the loop shaped holders 30.

Figure 2:
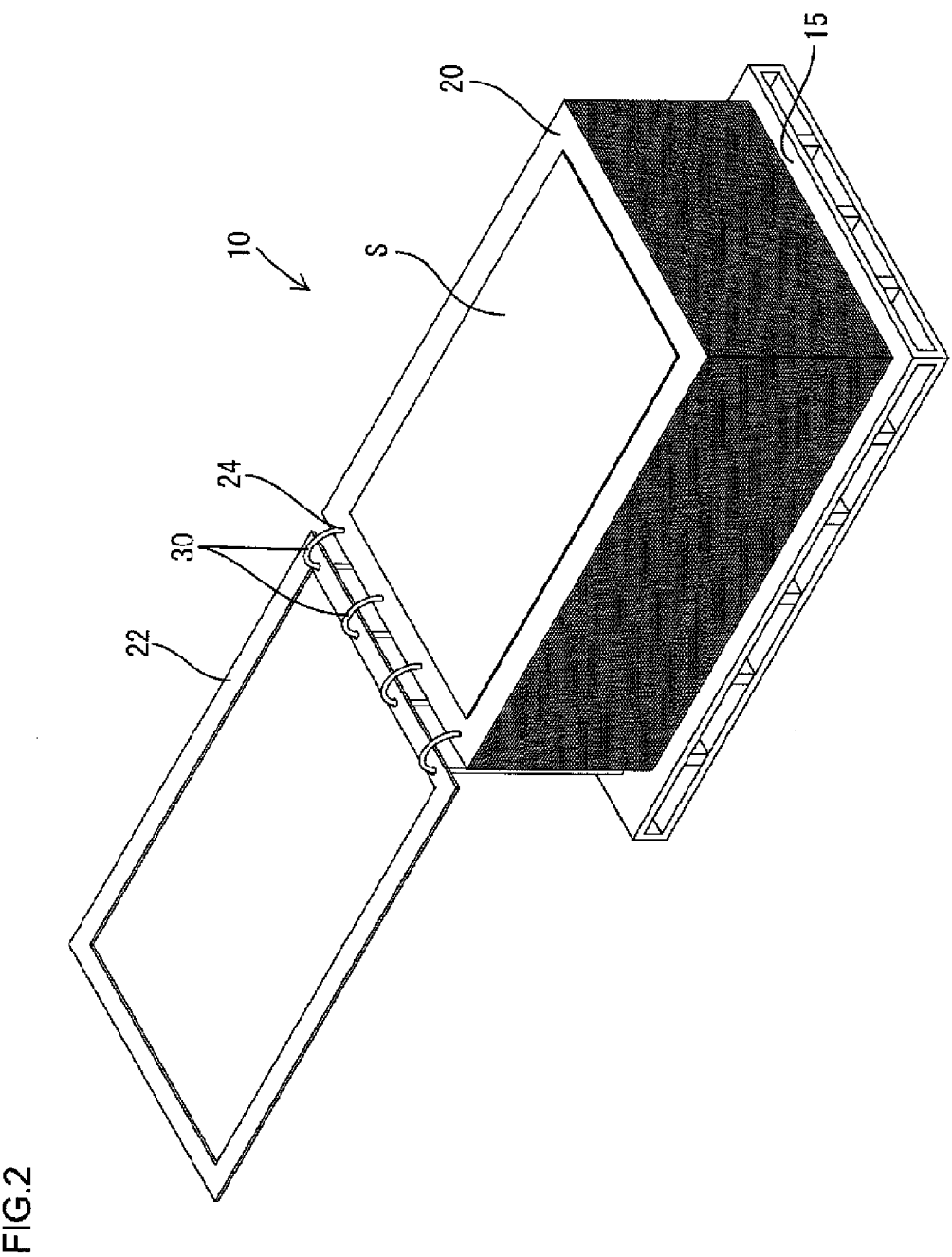
FIG. 2 is a perspective view of the substrate accommodating apparatus in a spread state.
Figure 3:
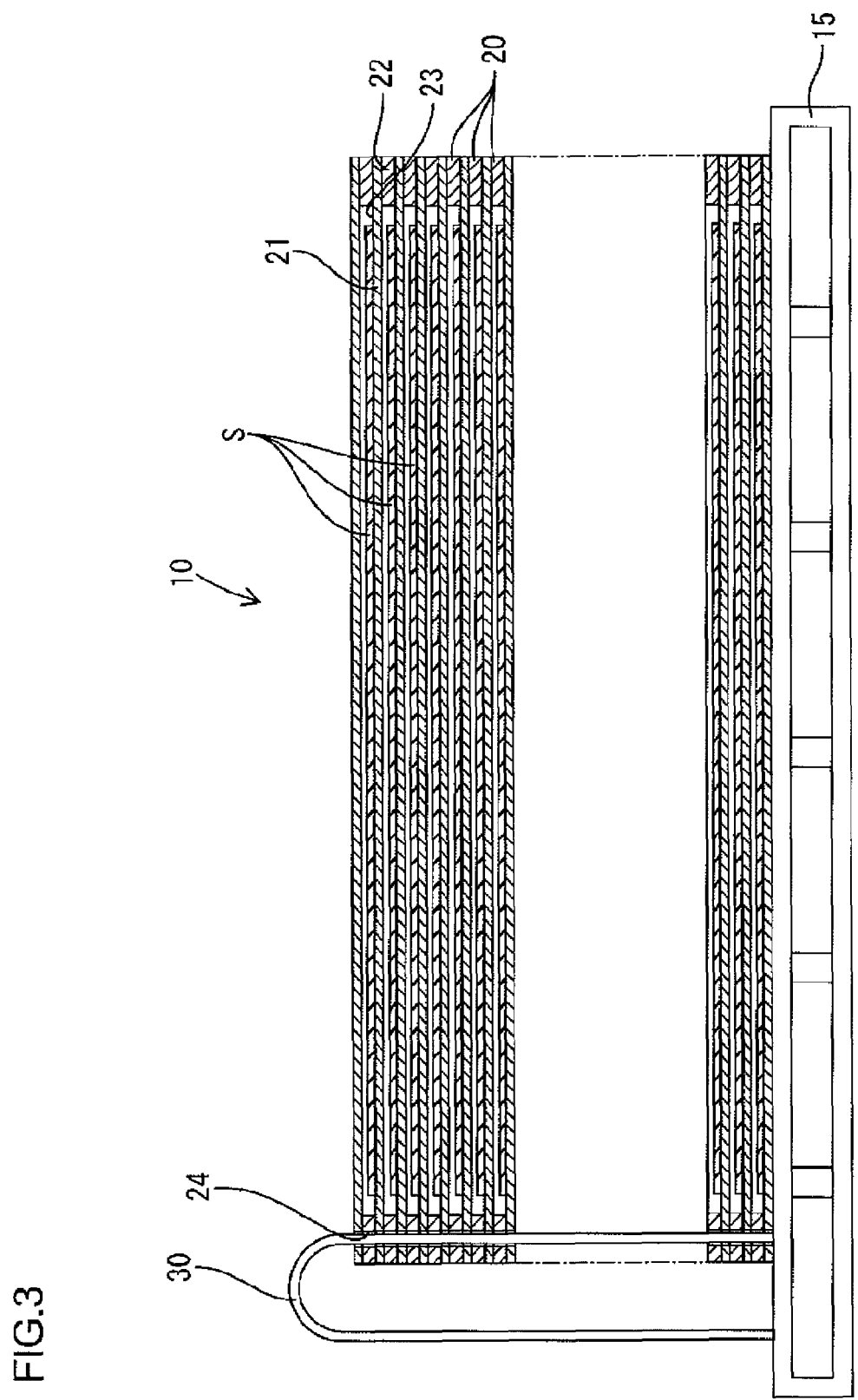
FIG. 3 is a cross-sectional view of the substrate accommodating apparatus.
Figure 4:
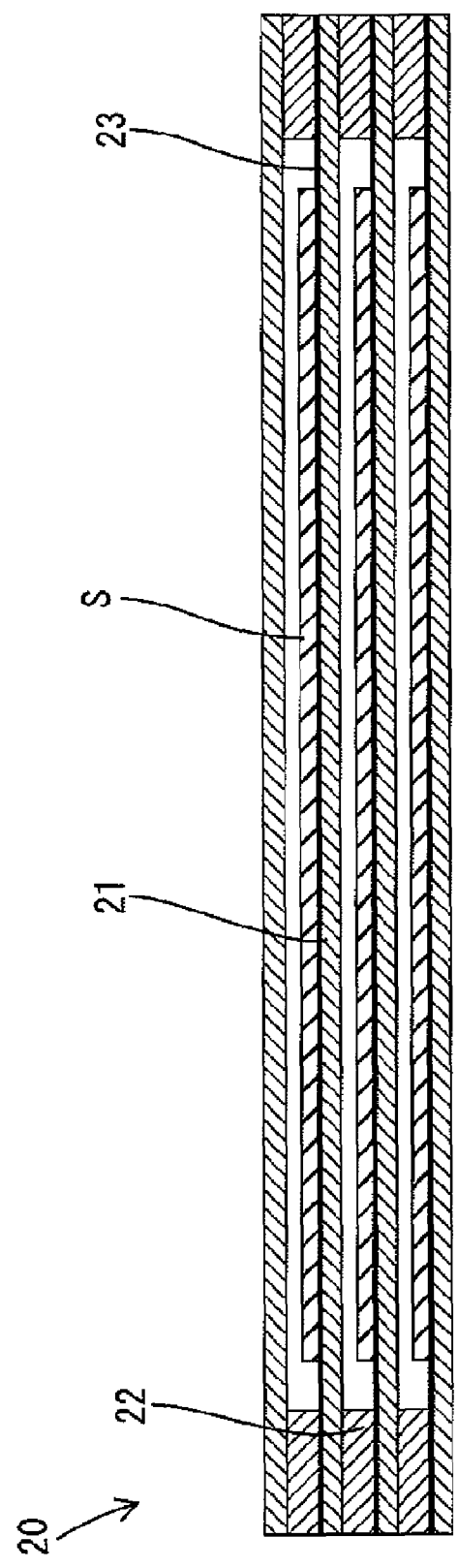
FIG. 4 is a cross-sectional view of accommodation bodies.

Now, a state where any one of the accommodation bodies 20 is stacked on the upper surface of an adjacent lower accommodation body 20, as shown in FIG. 1, is hereinafter named as "a stacked state." On the other hand, a state where any one of the accommodation bodies 20 is separated from the adjacent lower accommodation body 20 and spread toward the upper left direction in FIG. 2 is hereinafter named as "a spread state." That is, in the stacked state, the upper and the lower accommodation bodies 20 enclose the substrate S, thereby accommodating the substrate S. On the other hand, in the spread state, the upper surface of the buffer 21 of the adjacent lower accommodation body 20 is exposed and the substrate S can be placed in and taken out.

Meanwhile, where a holding structure for the accommodation bodies 20 is structured such that a stick-shaped member is inserted in an insertion hole 24, the members (the accommodation bodies 20) each having a drilled insertion hole 24 at a holding point thereof are movable only in an extending direction (the vertical direction in FIGS. 3) of the stick-shaped member (the loop-shaped holder 30) and the pivoting direction about the stick-shaped member. In the present embodiment, since a plurality of such stick-shaped members (loop-shaped holders 30) are disposed in a line, the accommodation bodies 20 are restricted from the pivoting movement about the loop-shaped holders 30 and allowed only for the movement in the extending direction of the loop-shaped holders 30. Therefore, when the accommodation bodies 20 of the present embodiment are transferred from the spread state to the stacked state, the accommodation bodies 20 are restricted from the movement in a plane direction. Therefore, positioning of the accommodation body 20 is arranged to be more reliably operated.

In the present embodiment, in addition, the loop-shaped holders are disposed at four points so that a force for holding the accommodation bodies 20 is improved by holding them with a plurality of loop-shaped holders 30.

A manner of accommodation and transportation of the substrates S by the substrate accommodating apparatus 10 configured as above will be now described.

First, the substrate S is placed onto the central portion of the upper surface of one of the accommodation bodies 20 (of the upper surface of the buffer 21), with directing a mounting surface downwardly (toward the buffer 21 side). Then, since the upper surface of the buffer 21 is provided with the substrate protect layer 23 and the mounting surface is in contact with the substrate protect layer 23, (the mounting surface of) the substrate S is prevented from damage; and, in addition, since the mounting surface is directed downwardly, fall and adhesion of dust to the mounting surface is avoided.

Next, another one of the accommodation bodies 20, which is positioned in the spread state, is stacked onto the accommodation body 20 where the substrate S is placed.

Then, the circumference of the substrate S are surrounded by the load receptacle 22 of the upper stacked accommodation body 20, while the upside of the substrate S is covered with the upper buffer 21, and thus the whole substrate S is enclosed by the upper and lower accommodation bodies 20 and is isolated from the exterior.

Then, in the substrate accommodating apparatus 10 of the present embodiment, when the accommodation bodies 20 are stacked, the upper load receptacle 22 places the load of the whole upper accommodation body 20 onto the periphery of the adjacent lower accommodation body 20. Then, the adjacent lower accommodation body 20 receives the load placed from the upper accommodation body 20 as well as its own load at its load receptacle 22, and the load receptacle 22 (of the lower accommodation body 20) places these loads onto the periphery of the further adjacent lower accommodation body 20. Finally, the loads of all accommodation bodies are received by the rigid plate 15 that is the lowest layer. Therefore, the central portion of the butter 21 of any one of the accommodation bodies 20 where the substrate S is placed does not receive any load other than the load of the substrate S. A plurality of accommodation bodies 20 thus can be stacked.

Finally, when substrates S are accommodated in all of the accommodation bodies 20, the substrate accommodating apparatus 10 is transported by being supported at the rigid plate 15 thereof by a forklift and the like.

As described above, according to the substrate accommodating apparatus 10 of the present embodiment, since any load from other members will not be placed on any one of the substrates S accommodated in the accommodation bodies 20, the structure for stacking a number of accommodation bodies 20 is enabled, and transportation of a number of substrates S is enabled. In this case, specifically when large-scale substrates S are accommodated, the weights of the substrates S themselves are heavier. Even in such a case, the load of any one of the accommodation bodies 20 is transferred via the load receptacles 22 to the peripheries of the lower accommodation bodies 20, and finally received by the rigid plate 15. Accordingly, any unreasonable load cannot be placed on the substrate S, and a number of substrate S can be transported even in the case when large-scale substrates S are accommodated.

Moreover, in the present embodiment, since the upper load receptacles 22 each surround the whole circumferences of the respective substrates S held by the respective lower accommodation bodies 20, and the upper and the lower accommodation bodies 20 enclose the respective substrates S, more reliable protection for the substrates S is enabled.

In addition, since each accommodation body 20 is held by a plurality of loop-shaped holders 30 and is positioned by them even when it is transferred from the spread state to the stacked state, placing and taking out operation for the substrates S is facilitated, and improvement of the operating efficiency is enabled.

Moreover, since the buffers 21 have some conductivity, the substrates S are prevented from electric charge, and adhesion of dust to the substrates by static electricity and the like, as well as electric influence to the substrate S and electrical components mounted on the substrate S, are prevented.

In addition, in the present embodiment, since the substrates S each are accommodated, with (the mounting surfaces thereof) being in contact with the respective substrate protect layers 23 made of cellulose, they are prevented from damage when being transported.

In addition, since such substrate protect layers 23 are formed of cellulose, they protect the substrates S more reliably. Also, the substrate protect layers 23 have durability and are endurable for repetitive use. Moreover, the cellulose contains few organic substances such as plasticizing agent and the like that ordinary resin materials would contain, and adhesion of such substances to the substrates S is avoided even in such a case as in the present embodiment where the substrate protect layers 23 made of cellulose are arranged to be in direct contact with the substrates S.

Second Embodiment

Figure 5:
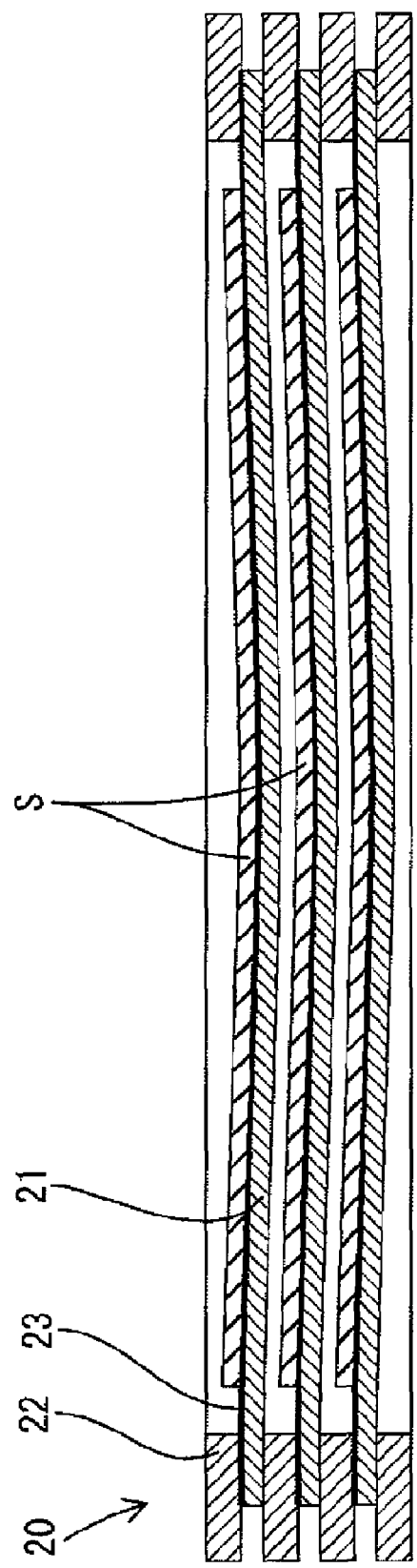
FIG. 5 is a cross-sectional view of accommodation bodies according to a second embodiment.

A second embodiment according to the present invention is below explained with reference to FIG. 5.

The present embodiment differs concerning the accommodation bodies 20 from the above first embodiment in that the buffers 21 each are secured underneath the respective load receptacles 22. The other same constructions are designated by the same reference numerals, while the overlapping explanations are omitted.

The buffers 21 of the present embodiment have elasticity in a range to be bendable when the respective substrates S are placed thereon.

Since this can more relieve the damage against the substrates S, more reliable protection for the substrates S is enabled.

Third Embodiment

A third embodiment according to the present invention is shown in FIG. 6.

The present embodiment differs from the above first and the second embodiments in that the buffer 21 and the load receptacle 22 of each of the accommodation bodies 20 are integrally formed. The other constructions same as those of the above embodiments are designated by the same numerals, while the overlapping explanations are omitted.

By applying such accommodation bodies 20, reduction of number of parts for the substrate accommodating apparatus 10 is enabled, and the substrate accommodating apparatus 10 becomes an economically advantageous one.

Other Embodiments

The present invention is not limited to the embodiments described above with reference to the drawings, the following embodiments are also included within the scope of the present invention. Further various variations other than the following embodiments are also possible within the scope and spirit of the invention.

(1) In the above embodiments, the buffers 21 are made of polypropylene, however, they are not limited to this but the material may be any other one having shock-absorbing characteristics such as polyethylene, for example.

(2) In the above embodiments, each of the load receptacles 22 are disposed so as to surround the whole circumference of the respective substrates S, however, the load receptacles 22 are not limited to this but may be the ones disposed at two opposing sides of the respective accommodation bodies 20, and, in this case, the load receptacles 22 may be the ones disposed at the longer sides or at the narrower sides of the respective accommodation bodies 20.

(3) In the above embodiments, the loop-shaped holders 30 hold one of the narrower sides of the each accommodation body 20, however, the loop-shaped holders 30 are not limited to this but may be structured to hold one of the longer sides of the each accommodation body 20.

Also, the loop-shaped holders 30 are structured to hold the each accommodation body 20 at four points, however, the loop-shaped holders 30 may hold it at two, three, five or more points.

Moreover, the loop-shaped holders 30 are disposed at regular intervals in the above embodiments, however, they are not limited to this but may be disposed with being centrally gathered or apart outwardly, for example.

(4) In the above embodiments, cellulose is applied for the substrate protect layers 23, however, they are not limited to this but pulp and the like may be applied, for example. Also, though cellulose, which has durability, is applied for the substrate protect layers 23 in the above embodiments and therefore the substrate protect layers 23 are the ones that may be used repetitively, the substrate protect layers 23 may be so-called disposable ones that are changed for every transportation of the substrates S, for example. In this case, paper and the like may be applied for the substrate protect layer 23, for example.

(5) The rigid plate 15 is not limited to the one of the above embodiments but may be any plate-shaped one having rigidity. For example, it may be structured with a thick metal plate.

INDUSTRIAL APPLICABILITY

The present invention relates to a substrate accommodating apparatus that enables transportation of a number of large-scale substrates, and has industrial applicability.

The invention thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A substrate accommodating apparatus, comprising:
a plurality of accommodation bodies, each accommodation body configured to accommodate a substrate and having a buffer and a load receptacle disposed on a periphery of the buffer so as to receive a load to the accommodation body when the accommodation bodies are stacked; and
a rigid plate for supporting said plurality of accommodation bodies such that said plurality of accommodation bodies are stacked on an upper surface of the rigid plate,
wherein said buffer has a surface for supporting the substrate and a substrate protect layer on the surface with which a mounting surface of the substrate is in contact so as to protect the mounting surface when the substrate is placed on the surface,
wherein said each accommodation body has an insertion hole extending from an upper surface to a lower surface thereof, the substrate accommodating apparatus further comprising,
a holder including a loop-shaped binding member attached to the rigid plate and penetrating through the insertion hole of said each accommodation body, such that said each accommodation body is transferable between a stacked state, in which at least one of the accommodation bodies is placed on the rigid plate, and a spread state, in which said at least one of the accommodation bodies is flipped over by sliding said at least one of the accommodation bodies along the loop-shaped binding member.

2. The substrate accommodating apparatus according to claim 1, wherein the buffer has some conductivity.

3. The substrate accommodating apparatus according to claim 1, wherein the substrate protect layer is formed of cellulose.

* * * * *